(12) United States Patent
Kim

(10) Patent No.: US 11,885,846 B2
(45) Date of Patent: Jan. 30, 2024

(54) SYSTEM AND METHOD OF TESTING A SEMICONDUCTOR DEVICE

(71) Applicant: SK hynix Inc., Icheon-si (KR)

(72) Inventor: Gyung Jin Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/082,381

(22) Filed: Dec. 15, 2022

(65) Prior Publication Data
US 2023/0122944 A1    Apr. 20, 2023

Related U.S. Application Data

(63) Continuation of application No. 16/912,022, filed on Jun. 25, 2020, now Pat. No. 11,543,450.

(30) Foreign Application Priority Data

Dec. 24, 2019    (KR) .................. 10-2019-0173968

(51) Int. Cl.
*G01R 31/28* (2006.01)

(52) U.S. Cl.
CPC ..... *G01R 31/2877* (2013.01); *G01R 31/2862* (2013.01); *G01R 31/2867* (2013.01)

(58) Field of Classification Search
None
See application file for complete search history.

(56) References Cited

U.S. PATENT DOCUMENTS

| | | | |
|---|---|---|---|
| 7,993,458 B2 | 8/2011 | Kondo et al. | |
| 9,870,964 B1* | 1/2018 | Yoshino | H01L 21/0228 |
| 11,002,761 B2 | 5/2021 | Genkin et al. | |
| 11,437,257 B2* | 9/2022 | Moriya | H01L 21/67742 |
| 11,543,450 B2* | 1/2023 | Kim | G01R 31/2867 |
| 2004/0217302 A1 | 11/2004 | Shin et al. | |
| 2008/0213082 A1* | 9/2008 | Kato | H01L 21/67253 |
| | | | 414/805 |
| 2008/0223399 A1* | 9/2008 | Onishi | H01L 29/7848 |
| | | | 257/E21.252 |
| 2010/0068009 A1 | 3/2010 | Kimura et al. | |
| 2016/0040288 A1 | 2/2016 | Wu et al. | |
| 2016/0345384 A1 | 11/2016 | Zhang et al. | |

(Continued)

FOREIGN PATENT DOCUMENTS

| | | |
|---|---|---|
| JP | 2017005133 A | 1/2017 |
| KR | 1020180078886 A | 7/2018 |

*Primary Examiner* — Jermele M Hollington

(74) *Attorney, Agent, or Firm* — William Park & Associates Ltd.

(57) ABSTRACT

A system for testing a semiconductor may include a transfer chamber, at least one loadlock chamber and at least one test chamber. The transfer chamber may include a plurality of sidewalls. The loadlock chamber may be arranged on a first sidewall of the sidewalls of the transfer chamber. The loadlock chamber may include a carrier configured to receive a plurality of wafers. The test chamber may be arranged on a second sidewall of the sidewalls of the transfer chamber. When the transfer chamber is connected to the loadlock chamber, a pressure of the transfer chamber may be changed into a pressure of the loadlock chamber. When the transfer chamber is connected to the test chamber, the pressure of the transfer chamber may be changed into a pressure of the test chamber.

6 Claims, 13 Drawing Sheets

(56) References Cited

U.S. PATENT DOCUMENTS

| | | |
|---|---|---|
| 2018/0073131 A1 | 3/2018 | Lee et al. |
| 2020/0083080 A1 | 3/2020 | Clark et al. |
| 2020/0098606 A1 | 3/2020 | Ishibashi |
| 2021/0202283 A1 | 7/2021 | Kim et al. |

* cited by examiner

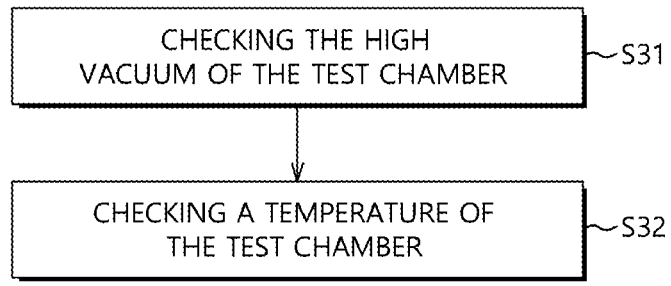
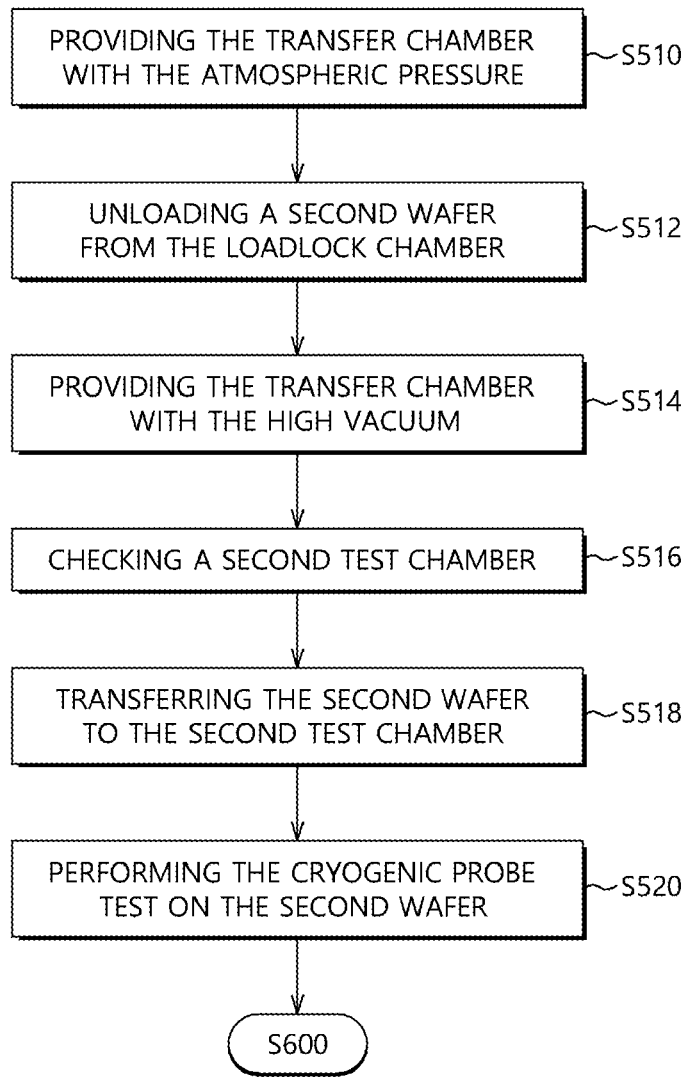

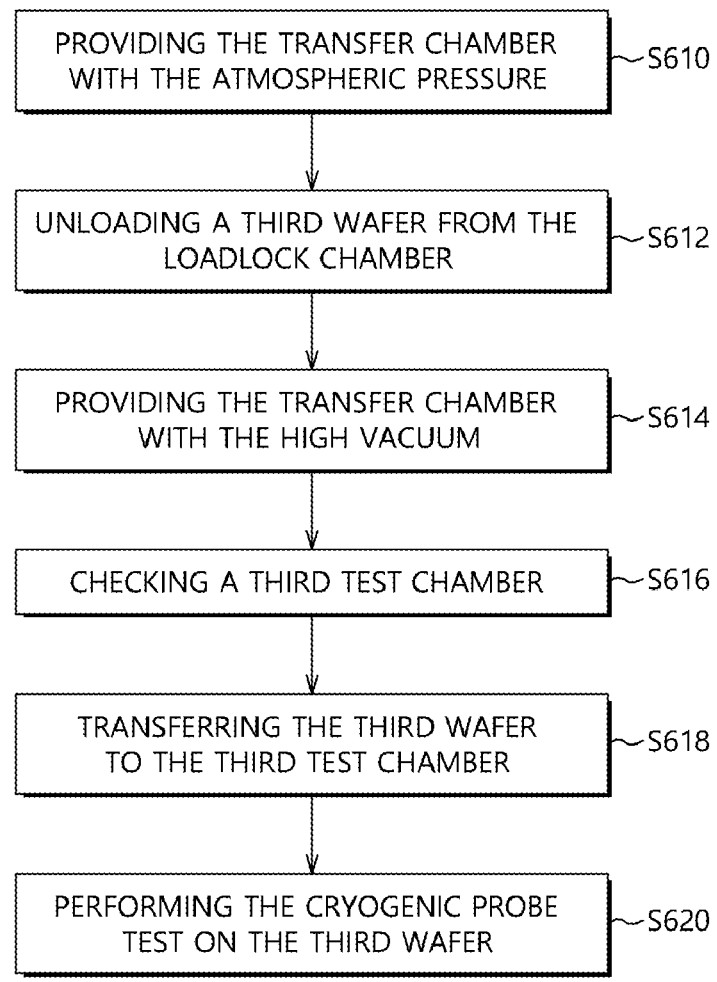

SYSTEM AND METHOD OF TESTING A SEMICONDUCTOR DEVICE

CROSS-REFERENCES TO RELATED APPLICATION

This application is a continuation of U.S. patent application Ser. No. 16/912,022, filed on Jun. 25, 2020, and claims priority under 35 U.S.C. § 119(a) to Korean application number 10-2019-0173968, filed on Dec. 24, 2019, in the Korean Intellectual Property Office, which is incorporated herein by reference in its entirety.

BACKGROUND

1. Technical Field

Various embodiments may generally relate to a system and a method of testing a semiconductor, more particularly, a probe test system and a probe test method capable of testing a semiconductor device under a cryogenic environment.

2. Related Art

A quantum arithmetic technology may be used for solving a difficult problem requiring massive calculations. A quantum arithmetic computer technology based on the quantum arithmetic technology, which may be superior to a super computer, may be developed.

Semiconductor devices having high performance such as various memory devices, for example, DRAMs provided to the quantum computer may require accuracy of a test.

Recently, in order to accurately test the semiconductor device having the high performance, a cryogenic environment test apparatus may be proposed. The cryogenic environment test apparatus may perform a test process under a cryogenic temperature, which may be formed by a cooling source such as liquid helium, and a high vacuum of about $10^{-7}$ torr.

The cooling source in a tank may be installed at a test chamber configured to perform the cryogenic test. The cryogenic test apparatus may be configured to receive a wafer. The cryogenic test apparatus may be connected with a cryogenic pump to have the high vacuum.

However, after the wafer is tested in the cryogenic test apparatus under the cryogenic temperature and the high vacuum, the temperature and the pressure of the cryogenic test apparatus may be changed into a room temperature and an atmospheric pressure to unload the wafer from the cryogenic test apparatus. Because the temperature and the pressure of the cryogenic test apparatus may be changed whenever the wafer is tested, a test time may be delayed.

Further, when the cooling source is consumed, in order to refill the cooling source or exchange the tank, it may be required to change the temperature and the pressure of the cryogenic test apparatus into the room temperature and the atmospheric pressure. Thus, the test process may be frequently stopped.

SUMMARY

In some embodiments of the present disclosure, a system for testing a semiconductor may include a transfer chamber, at least one loadlock chamber and at least one test chamber. The transfer chamber may include a plurality of sidewalls. The loadlock chamber may be arranged on a first sidewall of the sidewalls of the transfer chamber. The loadlock chamber may include a carrier configured to receive a plurality of wafers. The test chamber may be arranged on a second sidewall of the sidewalls of the transfer chamber. When the transfer chamber is connected to the loadlock chamber, a pressure of the transfer chamber may be changed into a pressure of the loadlock chamber. When the transfer chamber is connected to the test chamber, the pressure of the transfer chamber may be changed into a pressure of the test chamber.

In some embodiments of the present disclosure, a system for testing a semiconductor may include a transfer chamber, a plurality of loadlock chambers, a plurality of test chambers and a control module. The transfer chamber may include a transfer unit. The loadlock chambers may be arranged around the transfer chamber in a cluster shape. The test chambers may be arranged around the transfer chamber in the cluster shape. The control module may be configured to control operations of the transfer chamber, the loadlock chambers and the test chambers. The test chambers may be configured to perform a probe test of a wafer under a cryogenic environment. The wafer in the loadlock chambers may be transferred to the test chambers via the transfer chamber by the transfer unit. A tested wafer in the test chambers may be transferred to the loadlock chamber via the transfer chamber by the transfer unit. When the wafer is transferred between the transfer chamber and the test chamber, the transfer chamber may be controlled to have a pressure substantially the same as a pressure of the test chamber. When the wafer is transferred between the transfer chamber and the loadlock chamber, the transfer chamber may be controlled to have a pressure substantially the same as a pressure of the loadlock chamber.

In some embodiments of the present disclosure, according to a method of driving a semiconductor test system, the semiconductor test system may include a transfer chamber including a transfer unit, a plurality of loadlock chambers arranged the test chamber in a cluster shape and a plurality of test chambers arranged around the transfer chamber in the cluster shape, A cryogenic environment having a cryogenic temperature and a high vacuum may be provided to the test chambers. A first wafer in any one of the loadlock chambers may be transferred to the transfer chamber. The high vacuum may be applied to the transfer chamber with the first wafer. The first wafer in the transfer chamber may be transferred to a first test chamber, which might not perform a test process, among the test chambers. A cryogenic probe test may be performed on the first wafer.

In some embodiments of the present disclosure, a system for testing a semiconductor may include a test chamber and a loadlock chamber. The test chamber may have a cryogenic temperature and a high vacuum, A gate may be arranged between the test chamber and the loadlock chamber. The loadlock chamber may include a wafer carrier configured to receive a plurality of wafers, and a transfer unit configured to transfer the wafers one by one. The test chamber and the loadlock chamber may have a same pressure during the wafers in the wafer carrier may be tested.

In some embodiments of the present disclosure, a system for testing a semiconductor may include a test chamber, a prober, a wafer carrier and a transfer unit. The test chamber may have a cryogenic temperature and a high vacuum. The prober may be installed in the test chamber to perform a probe test of a plurality of wafers. The wafer carrier may be installed at one end of the prober to receive the wafers. The transfer unit may be arranged between the wafer carrier and the prober. The transfer unit may be configured to position the wafer in the wafer carrier at the prober. The transfer unit may be configured to transfer the wafer tested by the prober to the wafer carrier.

BRIEF DESCRIPTION OF THE DRAWINGS

FIGS. 5 to 10 are flow charts illustrating an operation of a semiconductor test system in accordance with some embodiments;

DETAILED DESCRIPTION

Various embodiments will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present disclosure as defined in the appended claims.

Although a few embodiments will be shown and described, it will be appreciated by those of ordinary skill in the art that changes may be made in these embodiments without departing from the principles and spirit of the present disclosure.

Figure 1:
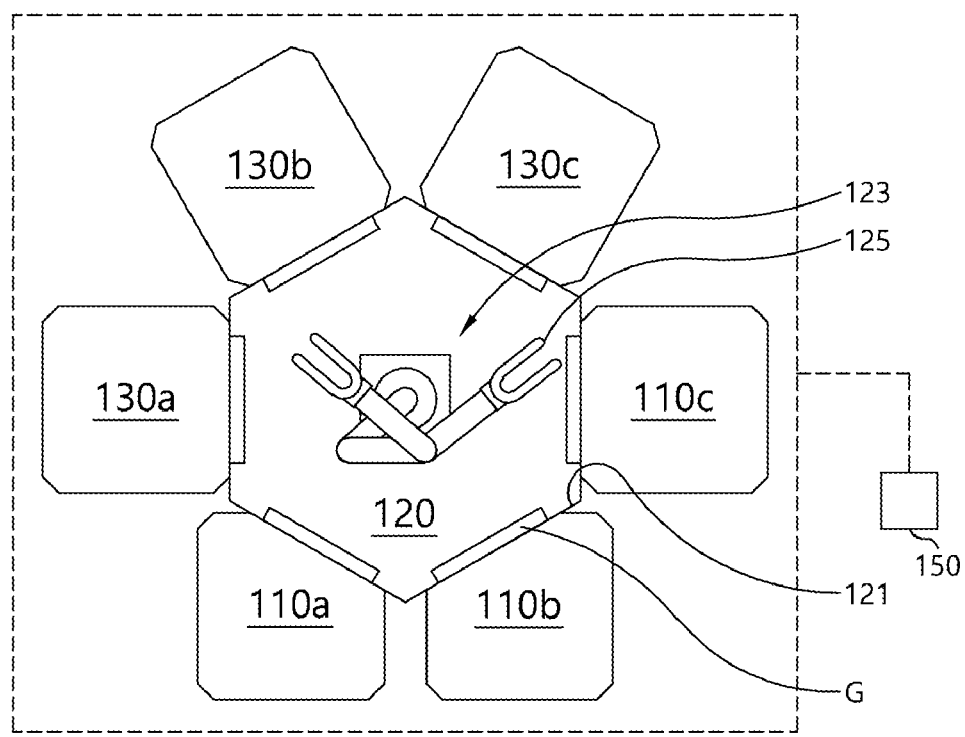
FIG. 1 is a plan view illustrating a semiconductor test system in accordance with some embodiments.

FIG. 1 is a plan view illustrating a semiconductor test system in accordance with some embodiments.

Referring to FIG. 1, a semiconductor test system 100 may include loadlock chambers 110a, 110b and 110c, a transfer chamber 120, test chambers 130a, 130b and 130c and a control module 150.

A wafer carrier (not shown) may be positioned in the loadlock chambers 110a, 110b and 110c. The wafer carrier (not shown) may be configured to receive tested wafers or wafers to be tested. The wafers may be temporarily located in the loadlock chambers 110a, 110b and 110c. The loadlock chambers 110a, 110b and 110c may have an atmospheric pressure and a room temperature.

The transfer chamber 120 may be configured to transfer the wafer between the loadlock chambers 110a, 110b and 110c and the test chambers 130a, 130b and 130c. For example, a planar structure of the transfer chamber 120 may have a polygonal shape. The loadlock chambers 110a, 110b and 110c and the test chambers 130a, 130b and 130c may be arranged around the transfer chamber 120. For example, the transfer chamber 120 may comprise a plurality of sidewalls. The loadlock chambers 110a, 110b and 110c are positioned at one of the sidewalls of the transfer chamber 120 and the test chamber 130a, 130b and 130c are positioned at the other of the sidewalls of the transfer chamber 120. The transfer chamber 120 may include a housing 121 and a transfer unit 123. A structure of the transfer chamber 120 may be illustrated later.

As mentioned above, the test chambers 130a, 130b and 130c may be configured to surround the transfer chamber 120 to perform a probe test.

The control module 150 may be configured to control elements of the loadlock chambers 110a, 110b and 110c, the transfer chamber 120 and the test chambers 130a, 130b and 130c in the semiconductor test system 100.

A reference numeral G may indicate a gate through which the wafer may be transferred. A reference numeral 125 may indicate a robot hand of the transfer unit 123 for loading the wafer.

Figure 2:
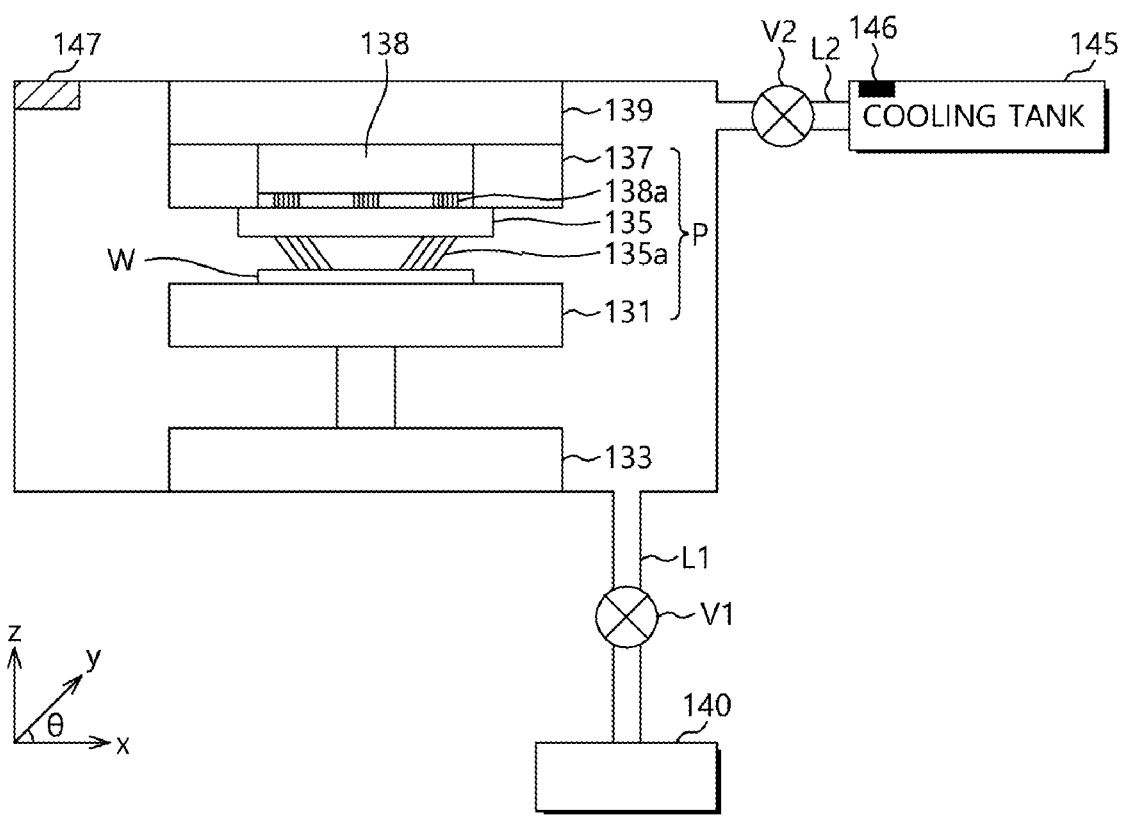
FIG. 2 is a cross-sectional view illustrating a test chamber in accordance with some embodiments.

FIG. 2 is a cross-sectional view illustrating a test chamber in accordance with some embodiments.

Referring to FIG. 2, each of the test chambers 130a, 130b and 130c may include a prober P, a high vacuum pump 140 and a cooling tank 145. The prober P may be positioned in the test chambers 130a, 130b and 130c.

The prober P may include a stage 131, an aligner 133, a probe card 135, a prober body 137 and a contact block 138.

The stage 131 may be configured to hold the wafer W loaded from the transfer chamber 120 using vacuum.

The aligner 133 may be configured to move the stage 131 in X, Y, Z and θ directions by an X-Y table unit, a Z-direction moving unit and a θ-direction moving unit to determine positions of the wafer W.

The probe card 135 may be arranged facing the stage 131. The probe card 135 may include a plurality of probes 135a configured to make contact with electrodes pads of the wafer W.

The prober body 137 may be configured to support the probe card 135.

The contact block 138 may be configured to electrically connect the probe card 135 with a tester motherboard 139. The tester motherboard 139 may be positioned over the contact block 138, The probe card 135 may be positioned under the contact block 138. The contact block 138 may include a plurality of pogo pins 138a configured to make contact with the probe card 135. The tester motherboard 139 and the contact block 138 may be electrically connected with each other by a soldering or a connector.

The high vacuum pump 140 may be connected with the test chambers 130a, 130b or 130c through a pumping line L1. The high vacuum pump 140 may be configured to provide the test chambers 130a, 130b and/or 130c with an internal pressure of $10^{-5}$ torr to $10^{-7}$ torr. A valve V1 may be installed on the pumping line L1. The valve V1 may be opened or closed by the control module 150 to control the internal pressure of the test chambers 130a, 130b and 130c.

The cooling tank 145 may supply a cooling source to the test chambers 130a, 130b and/or 130c through a cooling line L2. For example, the cooling source may include a permanent medium such as liquid nitrogen, liquid helium, etc. The cooling tank 145 may continuously supply the cooling source to the test chambers 130a, 130b and 130c to provide the test chambers 130a, 130b and 130c with an internal temperature of −50° C. to −196° C. A valve V2 may be installed on the cooling line L2. The valve V2 may be opened or closed by the control module 150 to control the internal temperature of the cooling tank 145.

The cooling tank 145 may include a flow sensor 146. The flow sensor 146 may sense an amount of the cooling source in the cooling tank 145. The flow sensor 146 may transmit a sensed amount of the cooling source to the control module 150. The control module 150 may control the cooling tank 145 to selectively fill the cooling tank 145 with the cooling source in accordance with the sensed amount of the cooling source so that the room temperature and the atmospheric pressure may be selectively provided to the test chambers 130a, 130b and 130c. That is, the control module 150 may control the valves V1 and V2 of the test chambers 130a, 130b and 130c to selectively provide the test chambers 130, 130b and 130c with the room temperature and the atmospheric pressure.

The test chambers 130a, 130b and 130c may include a pressure sensor 147. The pressure sensor 147 may measure the internal pressures of the test chambers 130a, 130b and 130c. The pressure sensor 147 may transmit measured internal pressures of the test chambers 130a, 130b and 130c to the control module 150. The control module 150 may control the opening/closing of the valve V1 in accordance with the measured internal pressures of the test chambers 130a, 130b and 130c to control the internal pressures of the test chambers 130a, 130b and 130c.

In some embodiments, the test chambers 130a, 130b and 130c may be configured to perform the probe test under a cryogenic environment having the high vacuum and the cryogenic temperature. The probe test may include contacting the probes 135a of the probe card 135 with the electrode pads of the wafer W. An electrical signal measured by the probes 135a may be transmitted to the control module 150 through the contact block 138 and the tester motherboard 139, The control module 150 may determine electrical characteristics of the wafer based on the electrical signal measured by the probes 135a, FIG. 3 is a cross-sectional view illustrating a transfer chamber in accordance with some embodiments.

Figure 3:
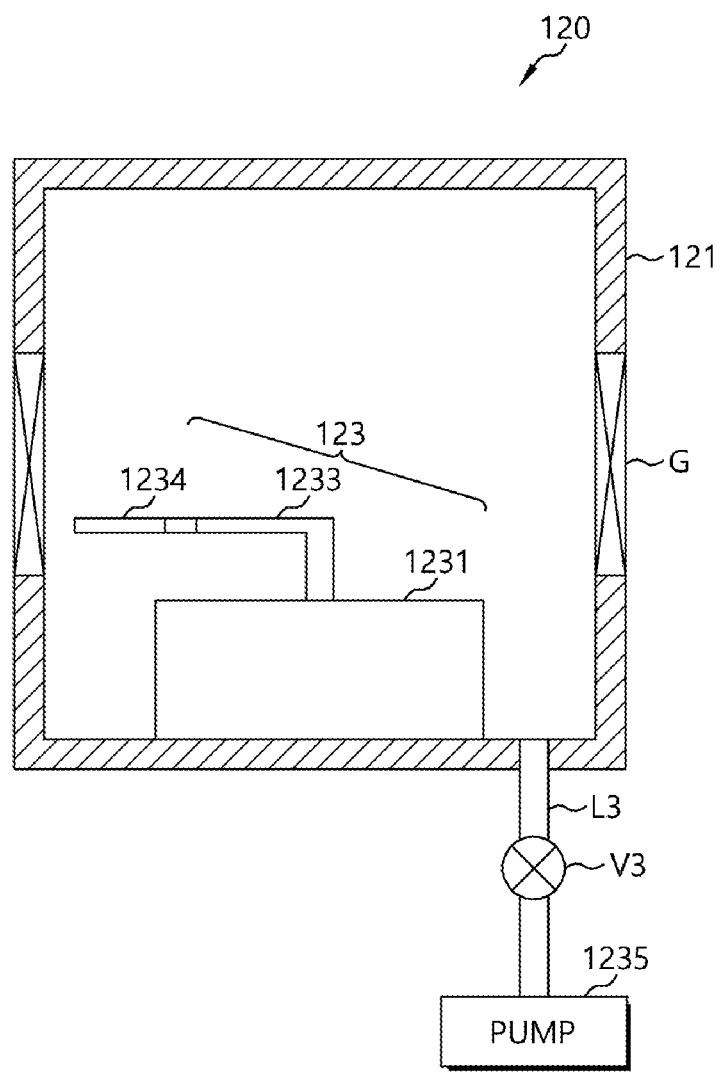
FIG. 3 is a cross-sectional view illustrating a transfer chamber in accordance with some embodiments.

Referring to FIG. 3, the transfer chamber 120 may have a processing space defined by the housing 121. The housing 121 may include a ceiling detachably combined with the housing 121, Thus, the ceiling may be opened in repairing the transfer chamber 120. The gate G may be installed at portions of housing 121 facing the loadlock chambers 110a, 110b and 110c and the test chambers 130a, 130b and 130c, The wafer W may be moved through the gate G.

The transfer chamber 120 may include the transfer unit 123 configured to transfer the wafer. The transfer unit 123 may include a body 1231 and a link arm 1233.

The body 1231 may be fixed to the transfer chamber 120. The body 1231 may include a driver configured to provide the link arm 1233 with a driving force. The driver may be installed in the body 1231.

The link arm 1233 may include a hand 1234. The link arm 1233 may receive the driving force from the driver. The link arm 1233 may be moved and rotated in horizontal and vertical directions to reach the hand 1234 to the loadlock chambers 110a, 110b and 110c and the test chambers 130a, 130b and 130c.

In some embodiments, the transfer chamber 120 may be connected with a pump 1235 through a pumping line L3. The pump 1235 may provide the transfer chamber 120 with an internal pressure substantially the same as the internal pressure of the test chambers 130a, 130b and 130c. That is, the internet pressure of the transfer chamber 120 may be changed from the atmospheric pressure to the high vacuum by the pump 1235. A valve V3 may be installed on the pumping line L3. The valve V3 may be opened or closed by the control module 150.

For example, when the transfer chamber 120 may be connected to the loadlock chambers 110a, 110b and 110c to load/unload the wafer into/from the loadlock chambers 110a, 110b and 110c, the valve V3 may be closed to stop the pump 1235. Thus, the transfer chamber 120 may have the atmospheric pressure.

For example, when the transfer chamber 120 may be connected to the test chambers 130a, 130b and 130c to load/unload the wafer into/from the test chambers 130a, 130b and 130c, the pump 1235 may provide the transfer chamber 120 with the high vacuum.

Because the transfer chamber 120 may have the high vacuum although the transfer chamber 120 may be connected to the test chambers 130a, 130b and 130c, a heat exchange might not be generated between the transfer chamber 120 and the test chambers 130a, 130b and 130c. Thus, it might not be required to provide the transfer chamber 120 with the cryogenic temperature.

Figure 4:
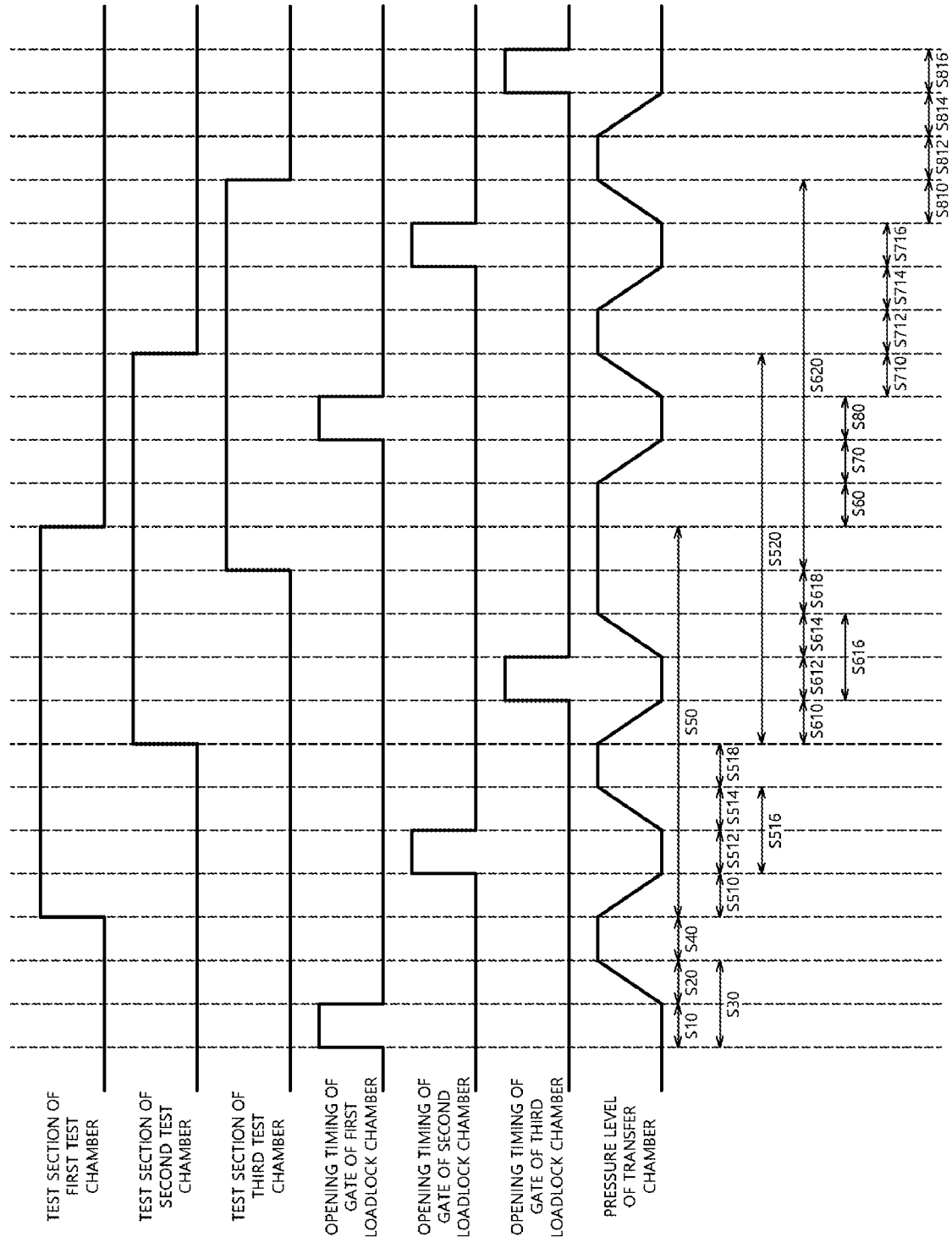
FIG. 4 is a timing chart illustrating an operation of a semiconductor test system in accordance with some embodiments.

FIG. 4 is a timing chart illustrating an operation of a semiconductor test system in accordance with some embodiments, and FIGS. 5 to 10 are flow charts illustrating an operation of a semiconductor test system in accordance with some embodiments.

Figure 5:
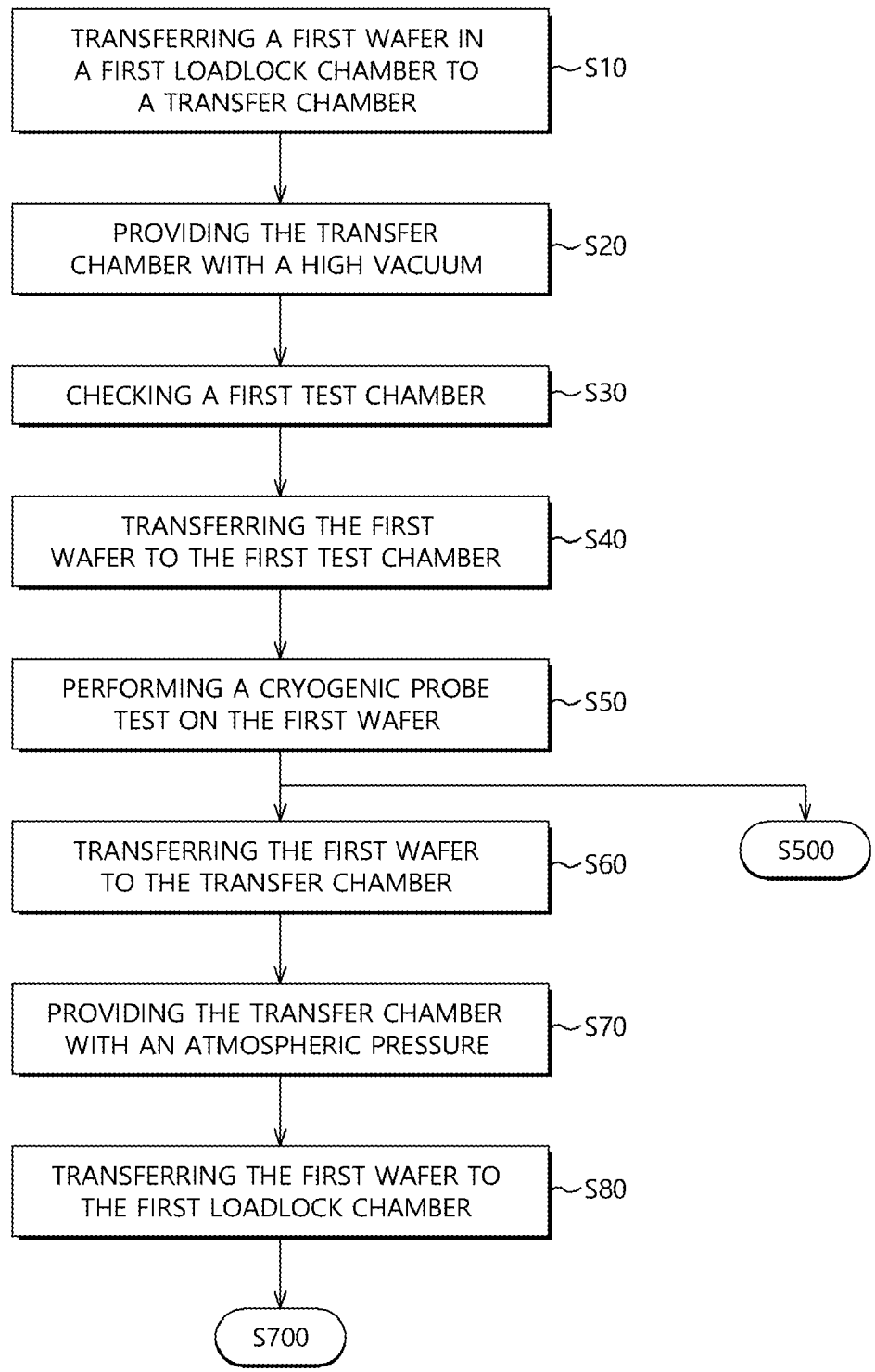

Referring to FIGS. 4 and 5, in step S10, the transfer unit 123 of the transfer chamber 120 may transfer any one of the wafers, for example, a first wafer in any one of the loadlock chambers 110a, 110b and 110c, for example, a first loadlock chamber 110a to the transfer chamber 120.

In step S10, the gate G of the first loadlock chamber 110a may be opened to connect the transfer chamber 120 with the first loadlock chamber 110a. Further, in step S10, the valve V3 may be closed to maintain the atmospheric pressure of the transfer chamber 120.

In step S20, after loading the wafer into the transfer chamber 120, the high vacuum may be supplied to the transfer chamber 120. The valve V3 may be opened and the pump 1235 may be driven to provide the transfer chamber 120 with the high vacuum.

During loading the wafer into the transfer chamber 120 in step S10 and providing the transfer chamber 120 with the high vacuum in step S20, in step S30, any one of the test chambers 130a, 130b and 130c, for example, a first test chamber 130a may be checked.

As shown in FIG. 6, checking the first test chamber 130a in step S30 may include checking the high vacuum of the first test chamber 130a and checking an internal temperature of the first test chamber 130a.

Checking the high vacuum of the first test chamber 130a in step S31 may include measuring an internal pressure of the first test chamber 130a using the pressure sensor 147. The control module 150 may drive the pump 1235 and the valve V3 until the cryogenic environment may be provide to the first test chamber 130a in accordance with measured internal pressures of the pressure sensor 147.

Checking the internal temperature of the first test chamber 130a in step S32 may be predicted from sensed results of the flow sensor 146 in the cooling tank 145, That is, the internal temperature of the first test chamber 130a may be checked based on an amount of the cooling source measured by the flow sensor 146. In some embodiments, checking the first test chamber 130a may be applied to all of the test chambers 130a, 130b and 130c.

In FIG. 4, test sections of the first to third test chambers 130a, 130b and 130c may represent sections in which an actual probe test may be performed. The internal temperature and the internal pressure of the first to third test chambers 130a, 130b and 130c may have the continuous cryogenic environment regardless of the test sections.

When the first test chamber 130a has the cryogenic environment and the internal pressure of the transfer chamber 120 is substantially the same as the internal pressure of the first test chamber 130a, the gate G between the transfer chamber 120 and the first test chamber 130a may be opened. In step S40, the first wafer in the transfer chamber 120 may then be transferred to the first test chamber 130a. Although a temperature difference may exist between the first test chamber 130a and the transfer chamber 120, the heat exchange might not be generated between the first test chamber 130a and the transfer chamber 120 because the first test chamber 130a and the transfer chamber 120 may have the high vacuum of about $10^{-5}$ torr to about $10^{-7}$ torr so that a problem caused by the temperature difference might not be generated.

In step S50, the cryogenic probe test may be performed on the first wafer in the first test chamber 130a, The probe card may make contact with the electrode pad of the first wafer in the first test chamber 130a having the cryogenic environment to test electrical characteristics of the first wafer.

Referring to FIG. 7, during the performance of the cryogenic probe test on the first wafer, in step S500, the transfer chamber 120 may transfer another wafer, for example, a second wafer in the first loadlock chamber 110a or the second or third loadlock chambers 110b or 110c to other test chambers 130b and 130c. In some embodiments, transferring the second wafer in the first loadlock chamber 110a may be illustrated for convenience of explanation.

In step S510, in order to transfer the second wafer, the internal pressure of the transfer chamber 120 may be changed into the atmospheric pressure.

When the transfer chamber 120 has the atmospheric pressure, the gate G between the first loadlock chamber 110a and the transfer chamber 120 may be opened. In step S512, the transfer unit 124 of the transfer chamber 120 may transfer the second wafer in the first loadlock chamber 110a to the transfer chamber 120.

In step S514, when the second wafer is loaded into the transfer chamber 120, the high vacuum may be applied to the transfer chamber 120. The high vacuum of the transfer chamber 120 may be formed by opening the valve V3 of the transfer chamber 120 and driving the pump 1235.

During the transferring the second wafer in step S512 and applying the high vacuum to the transfer chamber 120 in step S514, in step S516, the second test chamber 130b for testing the second wafer may be checked. The checking of the second test chamber 130b may be performed by a process substantially the same as that for checking the first test chamber 130a.

When the second test chamber 130b has the cryogenic environment and the internal pressure of the transfer chamber 120 is substantially the same as the internal pressure of the second test chamber 130b, the gate G between the transfer chamber 120 and the second test chamber 130b may be opened. In step S518, the second wafer in the transfer chamber 120 may then be transferred to the second test chamber 130b.

In step S520, the cryogenic probe test may be performed on the second wafer in the second test chamber 130b. The probe card may make contact with the electrode pad of the second wafer in the second test chamber 130b having the cryogenic environment to test electrical characteristics of the second wafer.

During performing the cryogenic probe test on the second wafer, in step S600, the transfer chamber 120 may transfer another wafer, for example, a third wafer in the first loadlock chamber 110a or the second or third loadlock chambers 110b or 110c to other test chambers 130b and 130c.

In step S610, in order to unload the third wafer from the first loadlock chamber 110a, the internal pressure of the transfer chamber 120 may be changed into the atmospheric pressure. In some embodiments, the third wafer may correspond to a wafer in the first loadlock chamber 110a, However, the third wafer may correspond to a wafer in the second loadlock chamber 110b or the third loadlock chamber 110c.

When the transfer chamber 120 has the atmospheric pressure, the gate G between the first loadlock chamber 110a and the transfer chamber 120 may be opened. In step S612, the transfer unit 124 of the transfer chamber 120 may transfer the third wafer in the first loadlock chamber 110a to the transfer chamber 120.

In step S614, when the third wafer is loaded into the transfer chamber 120, the high vacuum may be applied to the transfer chamber 120.

During the transferring of the third wafer in step S612 and applying the high vacuum to the transfer chamber 120 in step S614, in step S616, the third test chamber 130c for testing the third wafer may be checked. The checking of the third test chamber 130c may be performed by a process substantially the same as that for checking the first test chamber 130a.

When the third test chamber 130c has the cryogenic environment and the internal pressure of the transfer chamber 120 is substantially the same as the internal pressure of the third test chamber 130c, the gate G between the transfer chamber 120 and the third test chamber 130c may be opened. In step S618, the third wafer in the transfer chamber 120 may then be transferred to the third test chamber 130c.

In step S620, the cryogenic probe test may be performed on the third wafer in the third test chamber 130c. The probe card may make contact with the electrode pad of the third wafer in the third test chamber 130c having the cryogenic environment to test electrical characteristics of the third wafer.

After transferring the third wafer to the third test chamber 130c, the transfer chamber 120 may have a high pressure. When the transfer chamber 120 is not connected to the loadlock chambers 130a, 130b and 130c, the high pressure of the transfer chamber 120 may be maintained to unload the first wafer on which the cryogenic test may be performed.

Referring to FIG. 5, a gate G between the transfer chamber 120 having the high pressure and the first test chamber 110a completing the cryogenic test may be opened. In step S60, the transfer unit 123 of the transfer chamber 120 may transfer the tested first wafer to the transfer chamber 120.

In step S70, the atmospheric pressure may be applied to the transfer chamber 120. The valve V3 may be closed to provide the transfer chamber 120 with the atmospheric pressure substantially the same as that of the first loadlock chamber 130a.

In step S80, when the transfer chamber 120 has the atmospheric pressure, the tested first wafer may be transferred to the first loadlock chamber 110a.

In step S700, the transfer chamber 120 may perform processes for transferring the tested second wafer.

Figure 9:
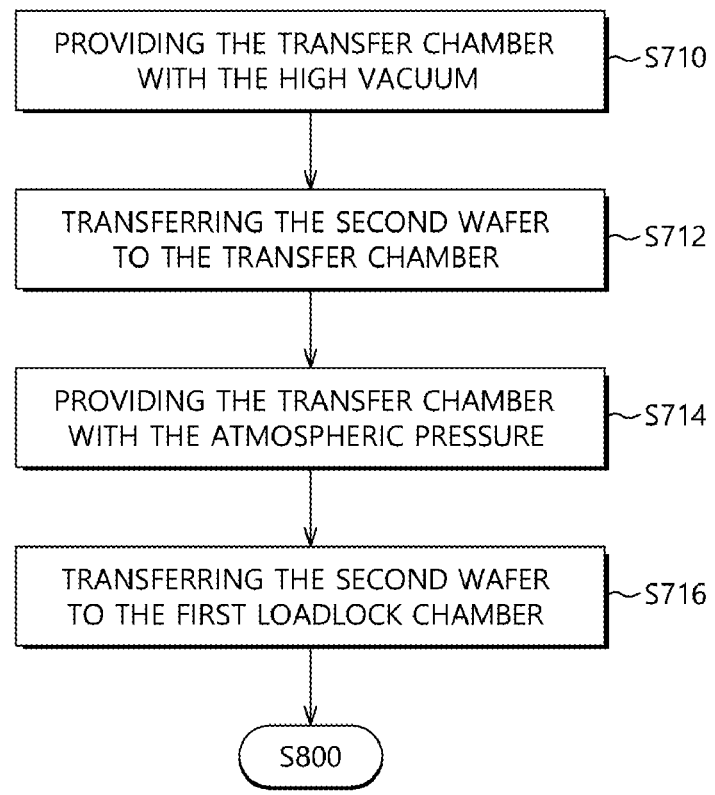

Referring to FIG. 9, in step S710, the high vacuum may be applied to the transfer chamber 120. When the internal pressure of the transfer chamber 120 is substantially the same as that of the second test chamber 130b, the gate G between the transfer chamber 120 and the second test chamber 110b may be opened. In step S712, the transfer unit 123 of the transfer chamber 120 may transfer the tested second wafer from the second test chamber 130b to the transfer chamber 120.

In step S714, after loading the tested second wafer into the transfer chamber 120, the atmospheric pressure may be applied to the transfer chamber 120 to provide the transfer chamber 120 with an internal pressure substantially the same as that of the first loadlock chamber 110a.

In step S716, when the transfer chamber 120 has the atmospheric pressure, a gate between the transfer chamber 120 and the first loadlock chamber 110a may be opened. The tested second wafer may then be transferred to the first loadlock chamber 110a.

In step S800, the transfer chamber 120 may perform processes for transferring the tested third wafer.

Figure 10:
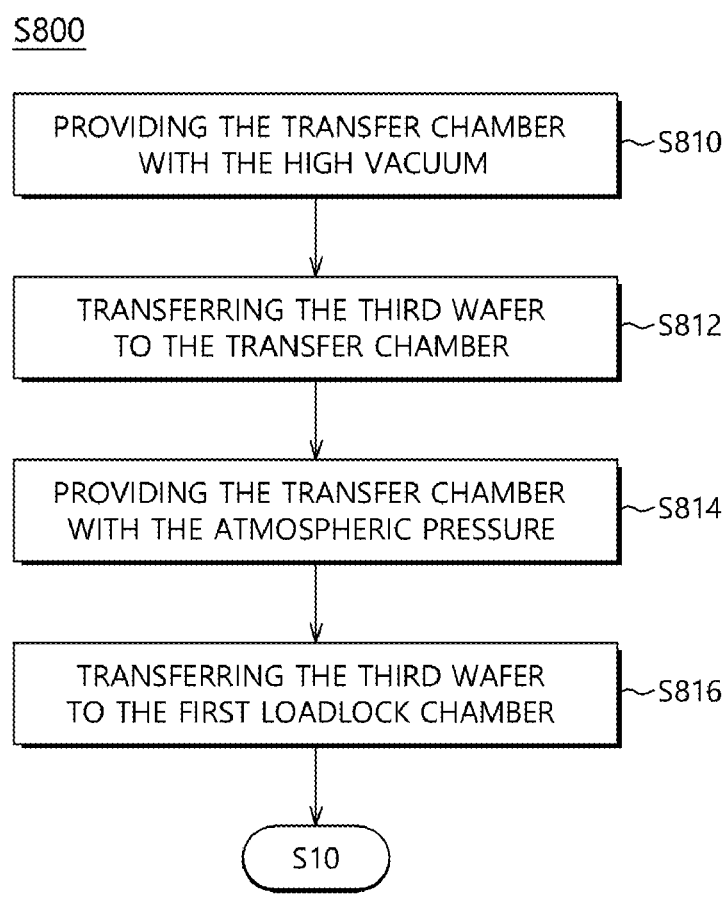

Referring to FIG. 10, in step S810, the high vacuum may be applied to the transfer chamber 120 to provide the transfer chamber 120 with an internal pressure substantially the same as that of the third test chamber 130c.

When the internal pressure of the transfer chamber 120 is substantially the same as that of the third test chamber 130c, the gate G between the transfer chamber 120 and the third test chamber 110c may be opened. In step S812, the transfer unit 123 of the transfer chamber 120 may transfer the tested third wafer from the third test chamber 130c to the transfer chamber 120.

In step S814, after loading the tested third wafer into the transfer chamber 120, the atmospheric pressure may be applied to the transfer chamber 120 to provide the transfer chamber 120 with an internet pressure substantially the same as that of the first loadlock chamber 110a.

In step S816, when the transfer chamber 120 has the atmospheric pressure, a gate between the transfer chamber 120 and the first loadlock chamber 110a may be opened. The tested third wafer may then be transferred to the first loadlock chamber 110a.

Figure 11:
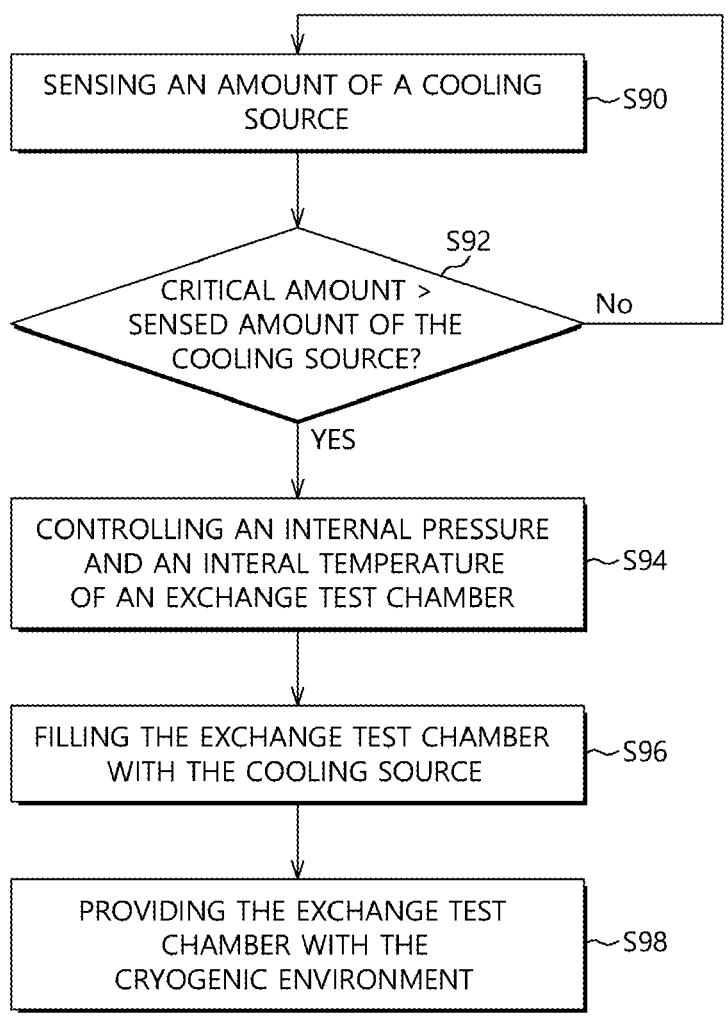
FIG. 11 is a flow chart illustrating a method of filling a cooling source in accordance with some embodiments.

FIG. 11 is a flow chart illustrating a method of filling a cooling source in accordance with some embodiments.

Referring to FIG. 11, in step S90, the flow sensors 146 in the cooling tank 145 of the test chambers 130a, 130b and 130c may continuously sense a flux of the cooling source in the cooling tank 145. For example, after transferring the tested wafer to the transfer chamber 120, the flow sensor 145 may detect the flux of the cooling source in the cooling tank 145.

In step S92, the control module 150 may compare the sensed flux of the cooling source by the flow sensor 146 with a critical amount. For example, the critical amount may correspond to an amount of the cooling source for performing the cryogenic probe test on one wafer.

When the sensed flux of the cooling source may be no more than the critical amount, that is, the cooling source in the cooling tank 145 might not perform the cryogenic probe test on one wafer, the control module may stop the supplying of the cooling source to a corresponding test chamber (hereinafter, referred to as an exchange test chamber). Further, the control module 150 may stop the valve V2 and the pump 140. Thus, in step S94, the exchange test chamber may be provided with the atmospheric pressure and the room temperature.

When the exchange test chamber may have the atmospheric pressure and the room temperature, the cooling tank 145 may be disconnected from the test chambers 130a, 130b and 130c. In step S96, the cooling tank 145 may be filled with the cooling source such as liquid helium.

When filling the cooling tank 145 with the cooling source, the cooling tank 145 may be connected to the exchange test chamber. The control module 150 may supply the cooling source to the exchange test chamber and drive the pump 140 to provide the exchange test chamber with the cryogenic temperature and the high vacuum, Thus, in step S98, the cryogenic temperature and the high vacuum may be provided to the exchange test chamber connected to the cooling tank 145 filled with the cooling source to perform the cryogenic probe test.

During filling the exchange test chamber with the cooling source, the wafer in the transfer chamber 120 may be transferred to an empty one of the transfer chambers 130a, 130b and 130c, not being on standby until the exchange test chamber is filled with the cooling source, so that the cryogenic probe test may be performed in the wafer in the empty transfer chamber.

When the empty test chamber does not exist, the wafer may be on standby in the transfer chamber 120. The wafer in the transfer chamber 120 may then be transferred to the test chamber in which the cryogenic probe test may be completed or filled with the cooling source.

Figure 12:
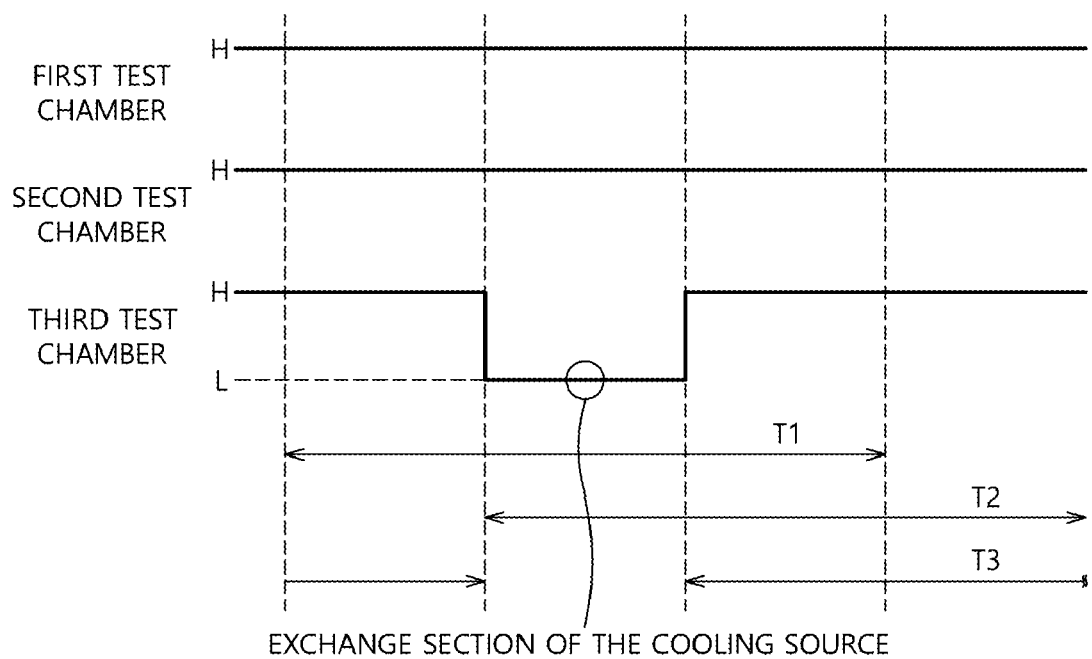
FIG. 12 is a view illustrating conditions of a temperature and a pressure in test chamber in accordance with some embodiments.

FIG. 12 is a view illustrating conditions of a temperature and a pressure in test chamber in accordance with some embodiments. In FIG. 12, "H" may indicate cryogenic states having the cryogenic temperature and the high vacuum, and "L" may indicate the atmospheric pressure and the room temperature.[

For example, when an amount of the cooling source in the third test chamber 130c among the first to third test chambers 130a, 130b and 130c is no more than the critical amount, the atmospheric pressure and the room temperature may be applied to the third test chamber 130c. The cooling source may then be supplied to the third test chamber 130c, Here, the first and second test chambers 130a and 130b may continuously have the cryogenic environment regardless of the third test chamber 130c to perform the cryogenic probe tests T1 and T2. Thus, although the cryogenic probe test in any one of the test chambers 130a, 130b and 130c may be stopped due to the filling of the cooling source, the cryogenic probe test may be performed in other test chambers to perform a multi-task. Here, T3 may represent a section of the cryogenic probe test in the third test chamber 130c.

In some embodiments, the semiconductor test system 100 may include the loadlock chambers 110a, 110b and 110c and the test chambers 130a, 130b and 130c, which may have the cryogenic environment, configured to surround the transfer chamber 120 in the cluster shape.

When the transfer chamber 120 is selectively connected to the loadlock chambers 110a, 110b and 110c and the test chambers 130a, 130b and 130c, the internal pressure and the internal temperature of the transfer chamber 120 may be changed between the atmospheric pressure and the room temperature and the high vacuum and the cryogenic temperature. Therefore, the test chambers 130a, 130b and 130c may be maintained as the cryogenic environment except for filling the cooling source to reduce a time loss for providing the cryogenic environment to the test chambers 130a, 130b and 130c.

Further, the test chambers 130a, 130b and 130c may sequentially perform the cryogenic probe test. Thus, when any one of the test chambers 130a, 130b and 130c is filled with the cooling source, the rest of the test chambers may continuously perform the cryogenic probe test so that the cryogenic probe test may be continuously performed without discontinuity of the cryogenic probe test to improve efficiency of the cryogenic probe test.

Figure 13:
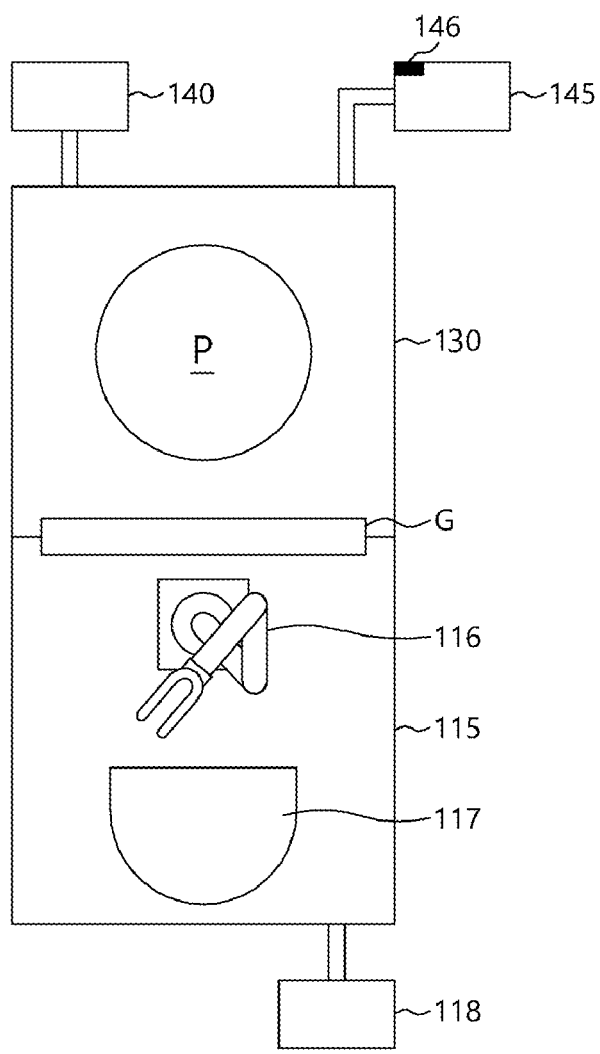
FIGS. 13 and 14 are plan views illustrating a semiconductor test system in accordance with some embodiments.
Figure 14:
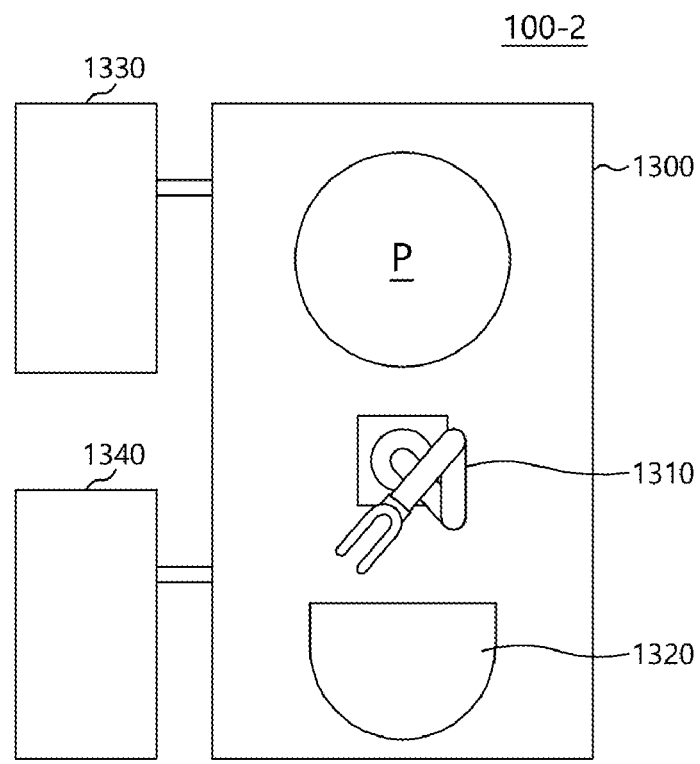

FIGS. 13 and 14 are plan views illustrating a semiconductor test system in accordance with some embodiments.

Referring to FIG. 13, a semiconductor test system 100-1 of some embodiments may include a test chamber 130 and a loadlock chamber 115.

The test chamber 130 may have a structure substantially the same as that of the test chamber 130 in FIG. 2. Thus, the test chamber 130 may include the prober P configured to perform the probe test, and the high vacuum pump 140 and the cooling tank 145 configured to provide the test chamber 130 with the cryogenic environment. Although not depicted in drawings, valves may be connected to the high vacuum pump 140 and the cooling tank 145 to control the amount of the cooling source and the pumping amount. Further, the flow sensor 146 may be installed in the cooling tank 145 to periodically sense the flux of the cooling source.

The loadlock chamber 115 may be directly connected to the test chamber 130 via a gate G. The loadlock chamber 115 may include a wafer carrier 116 configured to receive the wafers, and a transfer unit 117 configured to transfer the wafers. The loadlock chamber 115 may be connected to a pump 118 configured to provide the loadlock chamber 115 with the high vacuum, Therefore, the internal pressure of the loadlock chamber 115 may be changed from the atmospheric pressure to a pressure substantially the same as that of the test chamber 130.

As mentioned above, the loadlock chamber 115 may include the transfer unit 117. Thus, the wafer in the loadlock chamber 115 may be directly transferred to the test chamber 130, not via the transfer chamber.

Further, the high vacuum of the loadlock chamber 115 may be maintained during transferring the wafer to the test chamber 130. When the wafer carrier 117 in the loadlock chamber 115 is exchanged, the atmospheric pressure of the loadlock chamber 115 may be maintained.

According to some embodiments, it might not be required to change the environment of the test chamber 130 during testing the wafer in the wafer carrier 117, except for filling the cooling source to decrease the test time.

Referring to in FIG. 14, a semiconductor test system 100-2 of some embodiments may further include a test chamber 1300. The test chamber 1300 may include a transfer unit 1310 and a wafer carrier 1320 configured to receive the wafers as well as the prober P. Thus, the test chamber 1300 may include a high vacuum pump 1330 and a cooling tank 1340 configured to provide the test chamber 1300 with the cryogenic environment. Although not depicted in drawings, valves may be connected to the high vacuum pump 1330 and the cooling tank 1340 to control the amount of the cooling source and the pumping amount.

The test chamber 1300 of some embodiments may include the transfer unit 1320 and the wafer carrier 1320 to transfer the wafer in the test chamber 1300 having the cryogenic environment, Thus, it might not be required to change the environment of the test chamber 1300 during the wafers in the wafer carrier 1320 may be tested, except for filling the cooling source, to decrease the test time.

According to some embodiments, the environment of the test chamber might not be changed by the wafers in performing the cryogenic probe test on the wafer to greatly reduce the test time.

Further, the test chambers may be arranged in the cluster shape so that the cryogenic probe test may be continuously performed on the wafers to improve the test efficiency.

The above described embodiments are intended to illustrate and not to limit the present disclosure. Various alternatives and equivalents are possible. The embodiments are not limited by the embodiments described herein. Nor are the embodiments limited to any specific type of semiconductor device. Another additions, subtractions, or modifications are obvious in view of the present disclosure and are intended to fall within the scope of the appended claims.

What is claimed is:

1. A semiconductor test system comprising:
a test chamber in which a test process is performed between a first process environment and a second process environment;
a chamber comprising a wafer carrier configured to receive a plurality of wafers and a transfer unit configured to transfer the wafers to the test chamber, wherein the chamber is arranged to face the test chamber via a gate; and
a control module that configured to adjust a process environment of the chamber and a process environment of the test chamber,
wherein a selected one of the first process environment and the second process environment includes a temperature of −50° C. to −196° C. and a pressure of $10^{-5}$ torr to $10^{-7}$ torr.

2. The semiconductor test system of claim 1,
wherein the test chamber and the chamber include a pump configured to adjust the pressures of the test chamber and the chamber, respectively.

3. The semiconductor test system of claim 1,
wherein the other one of the first process environment and the second process environment includes a room temperature and an atmospheric pressure.

4. A semiconductor test system comprising a test chamber having an internal space for performing a probe test of a wafer under a cryogenic environment, the test chamber, comprising:
a wafer carrier configured to hold a plurality of wafer that have either undergone the probe test or are yet to be tested before the probe test;
a prober configured to test at least one of the wafers; and
a transfer unit positioned between the wafer carrier and the prober in the test chamber, wherein the transfer unit is configured to transfer the wafer that has been tested by the prober to the wafer carrier for storage or to transfer the wafer stored in the wafer carrier before the prober test onto the prober.

5. The semiconductor test system of claim 4, further comprising:
a pump configured to provide the internal space of the test chamber with a pressure corresponding to cryogenic environment; and
a cooling tank that adjusts a temperature of the internal space of the test chamber.

6. The semiconductor test system of claim 4,
wherein the cryogenic environment includes a temperature of −50° C. to −196° C. and a pressure of $10^{-5}$ torr to $10^{-7}$ torr.

* * * * *